US012753904B2

(12) United States Patent
Favre et al.

(10) Patent No.: US 12,753,904 B2
(45) Date of Patent: Oct. 6, 2026

(54) ILLUMINATED CONTROL MODULE FOR A MOTOR VEHICLE

(71) Applicant: DAV, Créteil (FR)

(72) Inventors: Thibaud Favre, Créteil (FR); Martial Berry, Créteil (FR)

(73) Assignee: DAV, Créteil (FR)

( * ) Notice: Subject to any disclaimer, the term of this patent is extended or adjusted under 35 U.S.C. 154(b) by 0 days.

(21) Appl. No.: 19/130,804

(22) PCT Filed: Oct. 17, 2023

(86) PCT No.: PCT/EP2023/078873

§ 371 (c)(1),
(2) Date: May 16, 2025

(87) PCT Pub. No.: WO2024/104685

PCT Pub. Date: May 23, 2024

(65) Prior Publication Data

US 2026/0194206 A1 Jul. 9, 2026

(30) Foreign Application Priority Data

Nov. 18, 2022 (FR) ...................................... 2212002

(51) Int. Cl.
*F21V 7/00* (2006.01)
*B60Q 3/82* (2017.01)
(Continued)

(52) U.S. Cl.
CPC ............ *F21V 7/0008* (2013.01); *F21V 11/08* (2013.01); *B60K 2360/143* (2024.01);
(Continued)

(58) Field of Classification Search
CPC ..... H03K 2217/96042; H03K 2217/96; H03K 2217/96038; H03K 2217/96079;
(Continued)

(56) References Cited

U.S. PATENT DOCUMENTS

2021/0347297 A1 11/2021 Cuvillier et al.

FOREIGN PATENT DOCUMENTS

DE 102019107358 A1 * 9/2020 ............. B60K 35/10
EP 3161912 A1 5/2017
(Continued)

OTHER PUBLICATIONS

Machine translation of FR 3109916 A1 retrieved from the FIT database of PE2E search. (Year: 2026).*
(Continued)

*Primary Examiner* — Colin J Cattanach

(74) *Attorney, Agent, or Firm* — Osha Bergman Watanabe & Burton LLP

(57) ABSTRACT

Described is a control module for a vehicle. The control module includes a front face having an outer layer which includes a pictogram, a control member, and a flexible printed circuit board fixed to an inner plate of the front face. The flexible printed circuit board includes a capacitive antenna for detecting the approach of an object. The pictogram faces the antenna. The printed circuit board incorporates a light-emitting diode for backlighting the pictogram. The diode is top-emitting and is placed on an end portion of the printed circuit board, and the end portion is fastened to a part of the front face that is perpendicular to a part of the front face that includes the pictogram. The module includes a reflector facing the pictogram, so that most of a light beam emitted by the diode is reflected by the reflector toward the pictogram.

11 Claims, 1 Drawing Sheet

(51) Int. Cl.

| | |
|---|---|
| ***F21V 11/08*** | (2006.01) |
| ***F21V 23/04*** | (2006.01) |
| ***F21Y 107/70*** | (2016.01) |
| ***F21Y 115/10*** | (2016.01) |
| ***H03K 17/96*** | (2006.01) |

(52) U.S. Cl.
CPC ................ *B60K 2360/1434* (2024.01); *B60K 2360/1438* (2024.01); *B60K 2360/1446* (2024.01); *B60K 2360/34* (2024.01); *B60K 2360/341* (2024.01); *B60K 2360/343* (2024.01); *B60K 2360/344* (2024.01); *B60K 2360/345* (2024.01); *B60Q 3/82* (2017.02); *F21V 23/0485* (2013.01); *F21Y 2107/70* (2016.08); *F21Y 2115/10* (2016.08); *H03K 17/962* (2013.01); *H03K 2217/96* (2013.01); *H03K 2217/96038* (2013.01); *H03K 2217/96042* (2013.01); *H03K 2217/960785* (2013.01); *H03K 2217/96079* (2013.01)

(58) Field of Classification Search
CPC ..... H03K 2217/960785; H03K 17/962; B60Q 3/82; F21V 23/0485; F21Y 2107/70; B60K 2360/143; B60K 2360/1434; B60K 2360/1438; B60K 2360/1446; B60K 2360/34; B60K 2360/341; B60K 2360/343; B60K 2360/344; B60K 2360/345
See application file for complete search history.

(56) References Cited

FOREIGN PATENT DOCUMENTS

| | | | | | |
|---|---|---|---|---|---|
| FR | 3022869 | A1 | | 1/2016 | |
| FR | 3064531 | A1 | * | 10/2018 | ........... G02B 6/0095 |
| FR | 3109916 | A1 | * | 11/2021 | ........... B60K 35/211 |
| WO | 2015200561 | A1 | | 12/2015 | |

OTHER PUBLICATIONS

Machine translation of DE 102019107358 retrieved from the FIT database of PE2E search. (Year: 2026).*
Machine translation of FR 3064531 A1 retrieved from the FIT database of PE2E search. (Year: 2026).*
International Search Report in corresponding International Application No. PCT/EP2023/078873, dated Jan. 24, 2024 (5 page).
Written Opinion in corresponding International Application No. PCT/EP2023/078873, dated Jan. 24, 2024 (5 pages).

* cited by examiner

[Fig. 1]
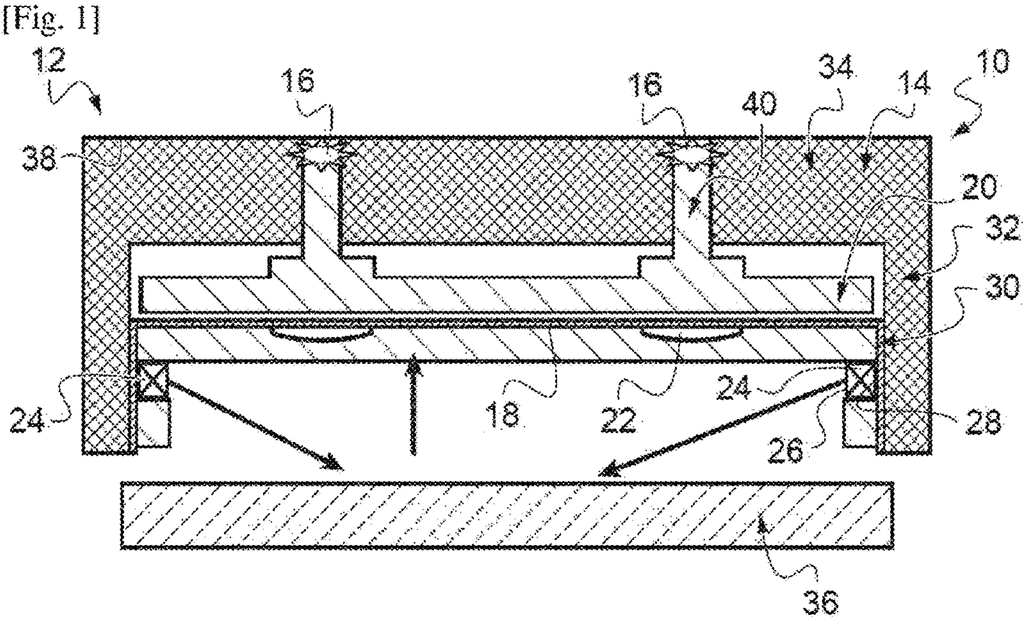
[Fig. 2]
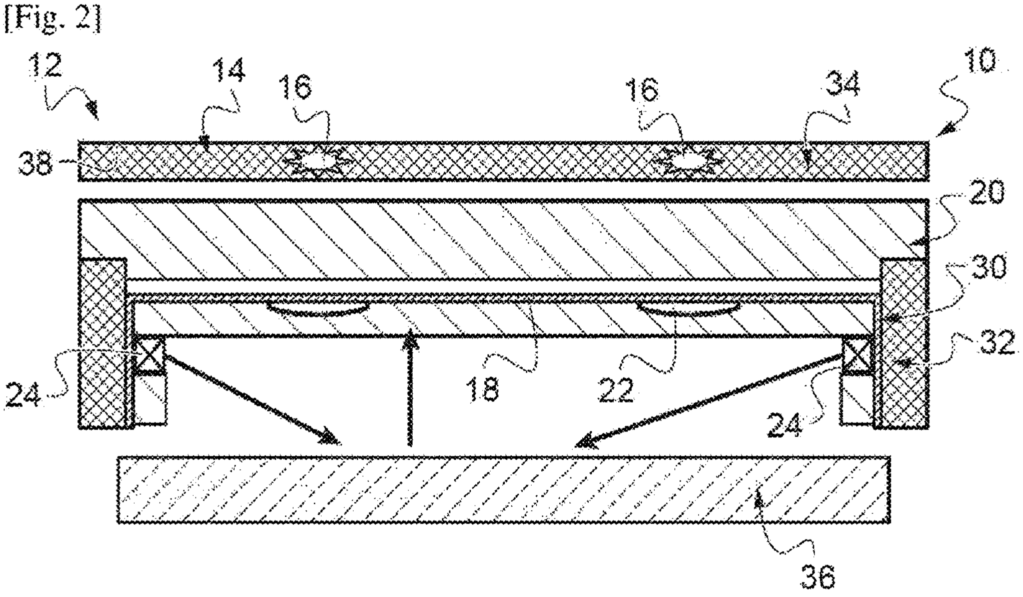
[Fig. 3]
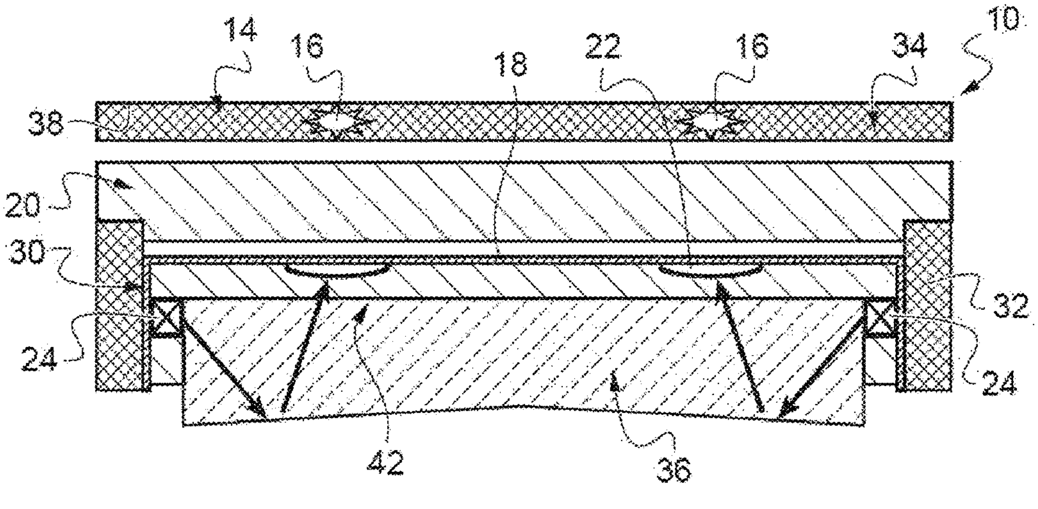

ILLUMINATED CONTROL MODULE FOR A MOTOR VEHICLE

The invention relates to an illuminated control module for a motor vehicle.

In the passenger compartment of a vehicle, use is made of control modules that allow the user to control on-board systems of the vehicle.

Some control modules are additionally provided with capacitive sensors that are equipped with capacitive antennas for detecting the user's finger approaching close to the interface. This approach detection may allow the interface to be activated before the user contacts the interface.

The control module allows the user, the driver or passenger, who actuates it to control on-board systems of the vehicle such as the air-conditioning system, radio system, music system, telephony system, ventilation system or navigation system.

Generally speaking, the control module comprises a front face with pictograms located close to control members. The prior art already discloses such a control module comprising a flexible printed circuit board carrying capacitive antennas for detecting the approach of the user's finger. In this prior-art module, the printed circuit board, which is fixed to an inner plate of a front face of the module, incorporates light-emitting diodes for backlighting the pictogram. By way of example, it is thus possible to control the backlighting through capacitive detection so as to make it easier to choose the pictogram and the control member associated therewith, for example when driving at night. In this prior-art module, use is made of edge-emitting light-emitting diodes, that is to say light-emitting diodes with a face emitting to the side with respect to the diode carrier.

Such edge-emitting diodes (also known as EELDs) are known for example from document EP3161912A1 or document FR3022869. Such diodes are formed of a stack of semiconductor layers with different doping levels and are designed such that light is emitted laterally with respect to the stack of layers, hence the name "edge-emitting".

However, in this prior-art module, the illumination of pictograms and other surfaces to be illuminated is not sufficiently homogeneous. Moreover, edge-emitting diodes are more complex in terms of their structure, and are therefore associated with a higher manufacturing cost. Moreover, the use of edge-emitting diodes requires the use of light guides, thereby also increasing cost price. In addition, because of the proximity between the diodes and the capacitive antennas, the diodes interfere with the operation of the capacitive sensors, thus generating module malfunctions. The presence of the diodes under the front face leads to an effect of visible sink marks on the surface of the module, which is responsible for a non-homogeneous appearance of the module, which may result in it being scrapped. The use of edge-emitting diodes is also associated with a significant horizontal footprint because the edge-emitting diodes have to be sufficiently spaced apart to obtain homogeneous illumination over the entire surface. Lastly, to control luminous homogeneity, it is necessary to use multiple diodes for a single pictogram.

The invention aims in particular to propose an improved illuminated control module for a motor vehicle that at least partially overcomes the abovementioned drawbacks.

To this end, the subject of the invention is an illuminated control module for a motor vehicle, the module comprising:

a front face comprising an outer layer comprising at least one pictogram, at least one control member, a flexible printed circuit board, fixed to an inner plate of the front face, and comprising at least one capacitive antenna intended to detect the approach of an object toward the control member, wherein the pictogram is located facing the capacitive antenna, the flexible printed circuit board incorporating at least one light-emitting diode for backlighting the pictogram, wherein:

the light-emitting diode is a top-emitting LED, the light-emitting diode is arranged on an end portion of the flexible printed circuit board that is intended to be fixed to a part of the front face that is perpendicular to a part of the front face comprising the pictogram, the control module also comprises a light reflector arranged opposite the pictogram, such that the majority of a light beam emitted by the diode is reflected by the light reflector toward the pictogram.

The diode is thus not located under the pictogram. This makes it possible to impose a minimum distance between the diode and the capacitive antenna, thus limiting the interfering effect of the diode on the antenna. This also prevents sink marks from being visible from outside the module.

A top-emitting diode (also known as top-emitting LED) is a "standard" diode. These are the least expensive standard LEDs. These standard LEDs are also manufactured by a stack of semiconductor layers, but a light cone is emitted from the top of this stack, hence the expression top-emitting LED. It differs from an edge-emitting diode in terms of its cone, in that the light-emitting face of the diode is the one located at the top of the stack of semiconductor layers. Such top-emitting diodes are known for example from document FR3064531.

"The majority of a light beam" corresponds to at least half of the light beam.

According to one aspect, the part of the front face that is perpendicular to the part comprising the pictogram is for example a zone for fixing the front face to a support housing therefor.

The part of the front face that is perpendicular to the part comprising the pictogram may be made of a material opaque to light, for example black polycarbonate.

According to another aspect, the flexible printed circuit board is transparent to light.

The flexible printed circuit board may be fixed to the inner plate of the front face by overmolding, adhesive bonding or any other assembly method.

According to further optional features of the illuminated control module, taken individually or in combination:

The flexible printed circuit board is for example fixed to the inner plate of the front face by overmolding.

An adhesive bonding step is thus avoided. Moreover, the adhesive could reduce the detection sensitivity of the capacitive antenna and could be an obstacle to light diffusing toward the pictogram.

The overmolding is in particular made of a material transparent to light, for example white polycarbonate.

The flexible printed circuit board is in particular fixed to the inner plate of the front face by overmolding.

The light-emitting diode is for example partially overmolded in the inner plate so that its emitting face is flush, that is to say not covered by the material of the inner plate.

The outer layer may be made of a material opaque to light, for example black polycarbonate, and the pictogram may be made of a material transparent or translucent to light, for example white polycarbonate.

The front face comprises for example a light diffusion plate interposed between the outer layer and the flexible printed circuit board.

It should be understood that the light diffusion plate is in particular made of a material transparent or translucent to light, for example white polycarbonate.

The diffusion plate makes it possible to homogenize the light reflected toward the pictogram.

The pictogram is in particular located on an outer face of the outer layer and a diffusion barrel extends in the outer layer, from the diffusion plate to the pictogram.

The diffusion barrel may be formed integrally with the diffusion plate, in particular molded integrally. Optionally, the diffusion barrel is formed in one piece with the diffusion plate.

The outer layer is in particular manufactured by bi-injection of a material transparent or translucent to light to produce the pictogram and of a material opaque to light to produce the portion of the outer layer that is not the pictogram.

The diffusion plate and the diffusion barrel are for example manufactured by bi-injection of the material transparent or translucent to light.

The outer layer is a decorative plastic film.

The film is for example made of polycarbonate.

Optionally, the pictogram is printed on the decorative plastic film.

Optionally, the pictogram is obtained by scraping the decorative plastic film.

The pictogram may be obtained by laser engraving.

The decorative plastic film may be overmolded on the inner plate.

The outer layer may also be a coating of paint, in particular opaque paint, for example black paint. The pictogram may be obtained on the coating of paint using the same methods as those mentioned for the decorative plastic film.

The light reflector is arranged offset from the light-emitting diode. This means that the reflector is not located opposite the diode, and the light rays emitted by the diode, which reach the reflector, are rays forming a non-zero angle with a longitudinal axis of a light beam emitted by the diode.

The reflector is for example a white plastic part or a mirror.

The light reflector comprises at least one portion located opposite the light-emitting diode, and a portion of the light beam emitted by the light-emitting diode diffuses into the light reflector so as to be reflected from a surface of the light reflector and then be diffused in the reflector toward the pictogram.

The diffusion in the reflector makes it possible to illuminate the pictogram more homogeneously.

BRIEF DESCRIPTION OF THE FIGURES

The invention will be better understood on reading the following description given solely by way of example and made with reference to the appended drawings in which:

FIG. 1 is a schematic view of an illuminated control module according to a first embodiment of the invention;

FIG. 2 is a schematic view of an illuminated control module according to a second embodiment of the invention;

FIG. 3 is a schematic view of an illuminated control module according to a third embodiment of the invention.

DETAILED DESCRIPTION

FIG. 1 shows an illuminated control module for a motor vehicle according to a first embodiment of the invention, designated by the general reference 10. The control module 10 comprises a front face 12 and at least one control member, not shown. The front face 12 gives a user access to the control member. The front face 12 is rigid, for example made of plastic. It in particular has a decorative function. The control member allows the user, the driver or passenger, who actuates it to control at least one on-board system of the vehicle such as the air-conditioning system, radio system, music system, telephony system, ventilation system or navigation system. The front face 12 comprises an outer layer 14 that comprises at least one symbol, or pictogram 16, two pictograms in the example shown. The pictograms 16 correspond to at least one respective control member.

The control module 10 also comprises a flexible printed circuit board 18, fixed to an inner plate 20 of the front face 12. The flexible printed circuit board 18 comprises at least one capacitive antenna 22, two capacitive antennas in the example shown. The capacitive antenna 22 makes it possible to detect the approach of an object, not shown, such as one or more fingers or the palm of the hand of the user, close to the control member, for example starting from a distance of the order of 40 millimeters. This detection may allow the control module to be activated before the user comes into contact therewith. The pictogram 16 is located facing the capacitive antenna 22.

The printed circuit board 18 incorporates at least one light-emitting diode 24 for backlighting the pictogram 16. The light-emitting diode 24 is a top-emitting LED. These top-emitting diodes comprise a stack of semiconductor layers, and a light cone is emitted from the top of this stack, hence the expression top-emitting LED. It differs from an edge-emitting diode in terms of its cone, in that the light-emitting face of the diode is the one located at the top of the stack of semiconductor layers. Such top-emitting diodes are known for example from document FR3064531.

In the present embodiment, the emitting face 26 of the diode 24 is positioned parallel to the carrier 28 of the diode 24.

The light-emitting diode 24 is arranged on an end portion 30 of the flexible printed circuit board 18. The end portion 30 is intended to be fixed to a part 32 of the front face 12 that is perpendicular to a part 34 of the front face 12 that comprises the pictogram 16. In the example of FIG. 1, the parts 32 and 34 form one and the same part. The part 32 of the front face that is perpendicular to the part 34 comprising the pictogram, referred to as "perpendicular part", is for example a zone for fixing the front face 12 to a support housing therefor, not shown. In the example shown, the perpendicular part 34 is made of a material opaque to light, for example black polycarbonate. In the example, the printed circuit board 18 is transparent to light.

The module 10 also comprises a light reflector 36 arranged opposite the pictogram 16, such that the majority of a light beam emitted by the diode 24 is reflected by the light reflector 36 toward the pictogram 16. This portion of the light beam reflected by the light reflector 36 toward the pictogram 16 is symbolized by the three arrows.

In the example of FIG. 1, the printed circuit board 18 is fixed to the inner plate 20 of the front face 12 by overmolding. More precisely, the printed circuit board 18 is fixed in the inner plate 20 of the front face 12 by overmolding. The diode 24 is partially overmolded in the inner plate 20 so that its emitting face 26 is flush, that is to say not covered by the material of the inner plate 20.

Moreover, the outer layer 14 is made of a material opaque to light, for example black polycarbonate, and the pictogram 16 is made of a material transparent or translucent to light, for example white polycarbonate.

Furthermore, the front face 12 comprises a light diffusion plate interposed between the outer layer 14 and the printed circuit board 18. In the example of FIG. 1, the diffusion plate is the inner plate 20. The light diffusion plate 20 is made of a material transparent or translucent to light, for example white polycarbonate. It makes it possible to homogenize the light reflected toward the pictogram 16.

Also in the example of FIG. 1, the pictogram 16 is located on an outer face 38 of the outer layer 14 and a diffusion barrel 40 extends in the outer layer 14, from the diffusion plate 20 to the pictogram 16. The diffusion barrel 40 is formed integrally with the diffusion plate 20. It is molded integrally with the diffusion plate 20. It is formed in one piece with the diffusion plate 20.

The outer layer 14 is manufactured by bi-injection of a material transparent or translucent to light to produce the pictogram 16 and of a material opaque to light to produce the portion of the outer layer that is not the pictogram 16. Manufacturing the outer layer 14 by bi-injection also makes it possible to manufacture the diffusion plate 20 and the diffusion barrel 40.

The light reflector 36 is arranged offset from the light-emitting diode 24. The reflector 36 is thus not located opposite the diode 24, and the light rays emitted by the diode 24, which reach the reflector 36, are rays forming a non-zero angle with a longitudinal axis of a light beam emitted by the diode 24. The reflector 36 is for example a white plastic part or a mirror.

FIG. 2 shows an illuminated control module 10 for a motor vehicle according to a second embodiment of the invention.

In this FIG. 2, and also in FIG. 3, elements similar to those in FIG. 1 are designated using identical references.

In this example and in the example of FIG. 3, the outer layer 14 is a decorative plastic film, more particularly made of polycarbonate. The film is overmolded on the inner plate 20. The pictogram 16 is obtained by scraping the film. It could also be obtained by printing the pictogram 16 on the film.

Furthermore, in the example of FIG. 3, the reflector 36 comprises at least one portion 42 located opposite the diode 24, and a portion of the light beam emitted by the diode diffuses into the reflector 36 so as to be reflected from a surface 44 of the reflector 36 and then be diffused in the reflector 36 toward the pictogram 16. The diffusion in the reflector 36 makes it possible to illuminate the pictogram 16 more homogeneously.

The invention is not limited to the embodiments presented, and further embodiments will be clearly apparent to a person skilled in the art.

LIST OF REFERENCES

10: control module
12: front face
14: outer layer of the front face
16: pictogram
18: flexible printed circuit board
20: inner plate of the front face
22: capacitive antenna
24: light-emitting diode
26: emitting face of the diode
28: diode carrier
30: end portion of the printed circuit board
32: perpendicular part
34: part comprising the pictogram
36: light reflector
38: outer face of the outer layer
40: diffusion barrel
42: portion of the reflector arranged opposite the diode

The invention claimed is:

1. An illuminated control module for a motor vehicle, the module comprising:

a front face comprising an outer layer comprising at least one pictogram;

at least one control member; and a flexible printed circuit board, fixed to an inner plate of the front face, and comprising at least one capacitive antenna intended to detect the approach of an object toward the control member, wherein the pictogram is located facing the at least one capacitive antenna, the flexible printed circuit board incorporating at least one light-emitting diode for backlighting the pictogram, wherein:

the at least one light-emitting diode is a top-emitting LED, the at least one light-emitting diode is arranged on an end portion of the flexible printed circuit board that is intended to be fixed to a part of the front face that is perpendicular to a part of the front face comprising the pictogram, the control module further comprising a light reflector arranged opposite the pictogram, such that a majority of a light beam emitted by the at least one light-emitting diode is reflected by the light reflector toward the pictogram.

2. The illuminated control module as claimed in claim 1, wherein the flexible printed circuit board is fixed to the inner plate of the front face by overmolding.

3. The illuminated control module as claimed in claim 1, wherein the outer layer is made of a material opaque to light, and the pictogram is made of a material transparent to light.

4. The illuminated control module as claimed in claim 1, wherein the front face comprises a light diffusion plate interposed between the outer layer and the flexible printed circuit board.

5. The illuminated control module as claimed in claim 4, wherein the pictogram is located on an outer face of the outer layer and a diffusion barrel extends in the outer layer, from the diffusion plate to the pictogram.

6. The illuminated control module as claimed in claim 5, wherein the diffusion barrel is formed integrally with the diffusion plate.

7. The illuminated control module as claimed in claim 6, wherein the outer layer is manufactured by bi-injection of a material transparent to light to produce the pictogram and of a material opaque to light to produce a portion of the outer layer that is not the pictogram.

8. The illuminated control module as claimed in claim 7, wherein the diffusion plate and the diffusion barrel are manufactured by bi-injection of the material transparent to light.

9. The illuminated control module as claimed in claim 1, wherein the outer layer is a decorative plastic film.

10. The illuminated control module as claimed in claim 1, wherein the light reflector is arranged offset from the at least one light-emitting diode.

11. The illuminated control module as claimed in claim 1, wherein the light reflector comprises at least one portion located opposite the at least one light-emitting diode, and a portion of the light beam emitted by the at least one light-emitting diode diffuses into the light reflector so as to be reflected from a surface of the light reflector and then be diffused in the light reflector toward the pictogram.

* * * * *